United States Patent [19]

Sugimoto et al.

[11] Patent Number: 5,180,431
[45] Date of Patent: Jan. 19, 1993

[54] APPARATUS FOR APPLYING LIQUID AGENT ON SURFACE OF ROTATING SUBSTRATE

[75] Inventors: Kenji Sugimoto; Mitsuhiro Fujita, both of Kyoto, Japan

[73] Assignee: Dainippon Screen Mfg. Co., Ltd., Japan

[21] Appl. No.: 538,239

[22] Filed: Jun. 14, 1990

[30] Foreign Application Priority Data

Jun. 14, 1989 [JP] Japan ............................ 1-70199[U]

[51] Int. Cl.$^5$ ............................................. B05C 11/02
[52] U.S. Cl. ..................................... 118/52; 134/104.1
[58] Field of Search ......................... 118/52, DIG. 4; 427/240; 134/104.1, 902.0, 34, 36

[56] References Cited

U.S. PATENT DOCUMENTS

| | | | |
|---|---|---|---|
| 4,528,934 | 7/1985 | Nakayama | 118/52 |
| 4,838,979 | 6/1989 | Nishida et al. | 118/52 |

FOREIGN PATENT DOCUMENTS

| | | | |
|---|---|---|---|
| 5840275 | 9/1981 | Japan | 118/52 |
| 57-135067 | 8/1982 | Japan | |
| 59-90928 | 5/1984 | Japan | 118/52 |
| 62-187679 | 11/1987 | Japan | |

Primary Examiner—W. Gary Jones
Assistant Examiner—Brenda Lamb
Attorney, Agent, or Firm—Ostrolenk, Faber, Gerb & Soffen

[57] ABSTRACT

An apparatus for applying liquid agent to a substrate includes a cup member for preventing liquid agent from scattering. Cleaning agent is supplied to an inner circumferential surface of the cup member through openings located at an upper portion of the inner circumferential surface. The structure for supplying the cleaning agent is integrally formed on an outer circumferential surface of the cup member. The apparatus also has a slanted surface for regulating and guiding air, liquid agent and cleaning agent downwardly through the cup member. Cleaning agent is supplied to the slanted surface through openings which are located at an upper portion thereof. Preferably, the openings are angled so that cleaning agent is directed substantially horizontally therefrom. Preferably, the apparatus has fine irregularities for spreading cleaning agent on the inner circumferential and slanted surfaces.

6 Claims, 4 Drawing Sheets

APPARATUS FOR APPLYING LIQUID AGENT ON SURFACE OF ROTATING SUBSTRATE

BACKGROUND OF THE INVENTION

1. Field of the Invention

The present invention relates to an apparatus for applying a liquid agent (such as photoresist and passivation) on a surface of a substrate (such as a semiconductor substrate, a ceramic substrate, a glass substrate or the like) while supporting the substrate by a spinchuck and while rotating the spinchuck in a cup which prevents the liquid agent from scattering. In particular, the present invention relates to an apparatus in which liquid agent which would otherwise adhere to the inside of the circumferential wall of the cup or to a member for regulating air flow in the cup can be efficiently rinsed.

2. Description of the Related Art

An apparatus of this kind is generally referred to as a "spinner". A spinner, as is well-known in the art, is used in a photoresist applying process, a developing process, an etching process and the like.

In the above described processes, when the liquid agent is applied to a rotating substrate, the liquid agent tends to adhere to the inside of a circumferential wall of the cup, to a member for regulating air flow in the cup and to other members. When the liquid agent adhering to the inside of the circumferential wall dries out and cakes, it changes into fine powder dust and scatters in the cup due to vibration of the rotating substrate, or the like. The scattered dust adheres to a surface of the substrate being processed, and thereby reduces production yield.

A spinner which is disclosed in Japanese Utility Model Application Laid Open No. 58-40275 is designed to eliminate the above-described disadvantage. Referring to FIGS. 1 and 2, the apparatus includes a cup 101 for preventing treatment solution from scattering and a spinchuck 110 provided at the center of the cup 101 for supporting a substrate W and for rotating the same. The cup 101 surrounds the spinchuck 110 and includes a circumferential wall 103 for preventing the treatment solution from scattering. A bottom wall 105 is located below the spinchuck 110 for receiving the dropping treatment solution.

The bottom wall 105 includes a ring-shaped bottom plate 106 protruding toward the center of the bottom wall 105 and a slant bottom surface 107 for catching the dropping treatment solution and for letting the same flow in the direction of the bottom plate 106. The bottom plate 106 has a ventilation duct 118 and a drain 119 for waste liquid. The slant bottom portion 107 is horn-shaped with a slant surface 116. A peripheral portion of the bottom portion 107 is connected to the bottom plate 106. The central portion of the bottom portion 107 is located near the top of the spinchuck 110.

The apparatus further includes a ring-shaped rinse agent conduit 117 provided around an upper edge portion of the slant bottom portion 107 for supplying rinse agent on the slant surface 116, and a ring-shaped rinse agent conduit 104 provided on an inner surface of an upper portion of the circumferential wall 103 for supplying the rinse agent on the inner surface of the circumferential wall 103.

In operation, the substrate W is fed to the spinchuck 110 by a substrate transporter (not shown) and is supported on the spinchuck 110 by vacuum suction or the like. After a nozzle (not illustrated) supplies photoresist to an upper surface of the substrate W, the spinchuck 110 is rotated by a motor (not illustrated) at a high speed. Excess photoresist is scattered around the substrate W by centrifugal force such that a uniform photoresist layer is formed on the upper surface of the substrate W.

The photoresist scattered around the substrate W adheres to the inner surface of the circumferential wall 103, to the slant surface 116 and the like. The conduit 104 supplies organic solvent to the inner surface 108 of the circumferential wall 103. The photoresist dissolves in the organic solvent and goes down toward the bottom plate 106 along the inner surface of the circumferential wall 103.

The conduit 117 supplies the organic solvent to the slant surface 116 of the slant bottom portion 107. Photoresist adhering to the slant surface 116 dissolves in the organic solvent and flows down the slant surface 116 toward the bottom plate 106.

A slope is formed on the upper surface of the bottom plate 106 for flowing waste liquid toward the drain 119. The waste liquid flows to the drain 119, from which it is externally discharged.

The air in the apparatus is forcibly discharged from the ventilation duct 118 to the outside.

The organic solvent is continuously supplied to the inner surface 108 of the circumferential wall 103 and the slant surface 116 through the rinse agent conduits 104 and 117, thereby preventing the photoresist from adhering to the inner surface 108 and the slant surface 116. Thus, the photoresist cannot dry to the surfaces 108 and 116, turn into fine dust and scatter around in the cup to adhere to the substrate W.

However, the conventional apparatus cannot completely eliminate the disadvantages of the prior art. Namely, the rinse agent is not supplied around the conduits 104 and 117. As a result, liquid agent adhering to the conduits 104 and 117 is never rinsed therefrom. The liquid agent adhering to the conduits 104 and 117 soon dries out and turns into powder, which is scattered in the cup and adheres to the substrate W. If this disadvantage were overcome, production yield would be improved.

SUMMARY OF THE INVENTION

Therefore, an object of the present invention is to provide an apparatus in which liquid agent is applied more efficiently to a substrate, thereby increasing production yield.

Another object of the present invention is to increase production yield by reducing particles of dried liquid agent scattering in a cup.

Another object of the present invention is to provide an apparatus in which liquid agent adhering to the inside of a cup and drying out can be reduced.

Another object of the present invention is to further reduce drying liquid agent by rinsing more of the liquid agent.

Another object of the present invention is to prevent liquid agent from adhering to a rinse agent conduit provided in a cup.

The present invention relates to an apparatus for applying liquid agent to a substrate, the apparatus including: (a) means for supporting and rotating a substrate; (b) means for applying liquid agent to the substrate while rotating the substrate; (c) a cup member for preventing liquid agent from scattering, the cup member including a circumferential wall, the circumferential wall including an inner circumferential surface and an upper portion, the upper portion of the circumferential wall including an inner surface and an outer surface, the inner surface of the upper portion including a plurality of openings; (d) first cleaning agent supplying means for supplying cleaning agent to the inner circumferential surface of the circumferential wall by supplying cleaning agent through the openings, the cleaning agent supplying means being ring shaped, the cleaning agent supplying means being integrally formed on the outer surface of the upper portion of the circumferential wall; (e) a slanted member with a slanted upper surface for regulating and guiding air, liquid agent and cleaning agent downwardly through the cup member, the slanted surface being lower than the supporting means, the slanted surface including an upper portion, the upper portion of the slanted surface including a plurality of openings, the slanted member including a lower surface and a lower edge, the lower surface including an upper portion; and (f) second cleaning agent supplying means for supplying cleaning agent to the slanted surface by supplying cleaning agent through the openings of the slanted surface, the second cleaning agent supplying means being ring shaped, the second cleaning agent supplying means being integrally formed on the upper portion of the lower surface of the slanted member.

Preferably, the apparatus further includes: (g) a waste liquid zone for collecting liquid agent and cleaning agent drained from the inner circumferential surface and the slanted surface; (h) a ventilation zone for collecting air which is guided by the slanted member; and (i) a separating wall for separating the ventilation zone from the waste liquid zone, the separating wall being located radially within the lower edge of the slanted member, the separating wall having an upper edge which is located above the lower edge of the slanted member.

Preferably, the openings of the cup member and of the slanted member are angled such that cleaning liquid is directed substantially horizontally out of the openings of the cup member and substantially horizontally out of the openings of the slanted member so as to cover the inner circumferential surface and the slanted surface with cleaning agent.

Preferably the apparatus includes fine irregularities for spreading cleaning agent.

Thus, according to the present invention, liquid agent applied to the substrate cannot scatter and adhere to the first and second ring-shaped conduits, and dried liquid agent adhering thereto cannot turn into fine powder to contaminate the surface of the substrate. Thus, production yield is improved compared to the conventional apparatus.

The foregoing and other objects, features, aspects and advantages of the present invention will become apparent from the following detailed description of the present invention when taken in conjunction with the accompanying drawings.

DETAILED DESCRIPTION OF THE PREFERRED EMBODIMENTS

Figure 3:
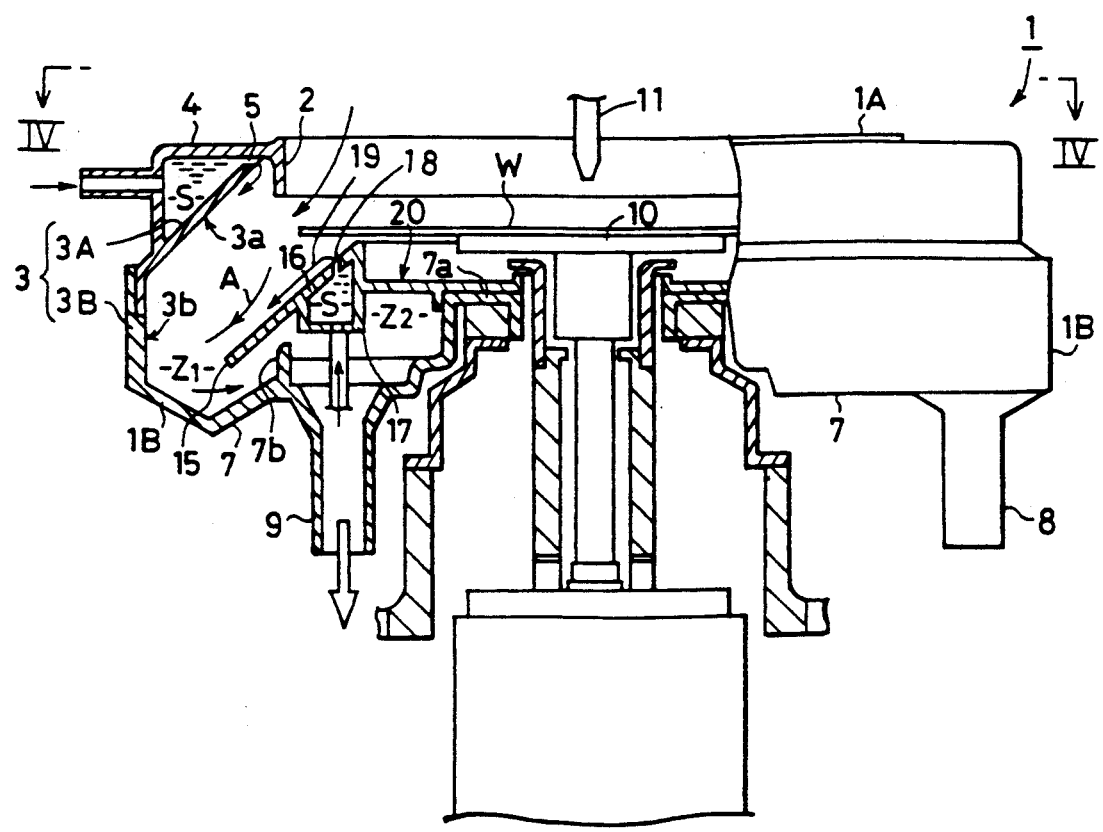
FIG. 3 is a partially sectional view of an apparatus according to a preferred embodiment of the present invention.
Figure 4:
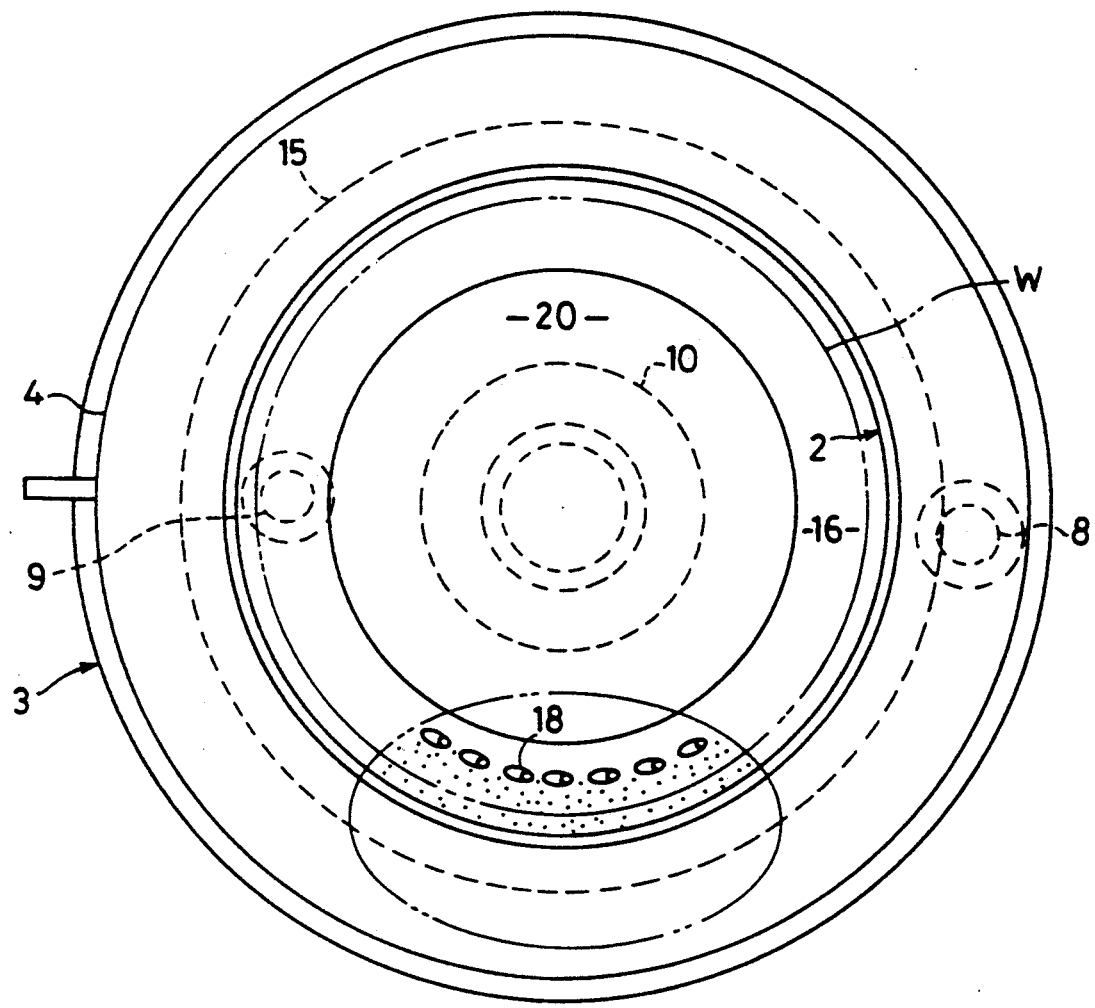
FIG. 4 is a plan view taken in the direction of the arrow IV—IV of FIG. 3.

Referring to FIGS. 3 and 4, an apparatus according to a preferred embodiment of the present invention includes a cup 1 for collecting liquid agent and for preventing splashed droplets of the liquid agent from scattering, a horizontally rotatable spinchuck 10 provided at the central portion of the cup 1, for supporting a lower surface of the substrate W by suction and for horizontally rotating the same about a spin axis, a nozzle 11 provided above the spinchuck 10 for supplying liquid agent (such as photoresist) to an upper surface of the substrate W, and a member 15 provided below and around the spinchuck 10 for regulating the downward airflow from above the substrate W.

The cup 1 includes a lower cup 1B and an upper cup 1A which is detachably attached to the lower cup 1B. The upper cup 1A includes a circumferential wall 3A which forms a horn opening downward. The circumferential wall 3A has an inner surface 3a which is opposed to the spinchuck 10 and a circumferential surface 3b which faces the opposite side of the spinchuck 10. A cylindrical air intake 2 is formed in the upper portion of the circumferential wall 3A. A large number of discharge openings 5 are formed in an upper end portion of the circumferential wall 3A. The discharge openings 5 penetrate through the circumferential surface to the inner surface of the circumferential wall 3A for discharging the rinse agent.

The upper cup 1A further includes a ring-shaped hollow conduit 4 which surrounds the air intake 2 along the upper portion of the circumferential surface of the circumferential wall 3A. The conduit 4 supplies the rinse agent to the inner surface 3a through the discharge openings 5. The conduit 4 is in fluid communication with the inner portion of the upper cup 11A through the discharge openings 5. The discharge openings 5 each extend slightly slanted with respect to a direction tangent to the inner surface 3a of the circumferential wall 3A. The rinse agent 6 flowing out from the discharge openings 5 spreads in a generally direction downward and circumferential direction along the inner surface 3a towards the inner surface 3b.

The lower cup 1B includes a circumferential wall 3B. The wall 3B is in engagement with the opening in the lower portion of the horn formed by the circumferential wall 3A and a bottom wall 7 which is integrally formed with a lower end of the circumferential wall 3B. The bottom wall 7 defines the bottom of the cup 1. The circumferential walls 3A and 3B form a circumferential wall 3 of the cup 1.

The inner surfaces of the circumferential walls 3A and 3B are "satin-finished". Namely, a lot of fine irregularities are formed on the inner surfaces of the circumferential walls 3A and 3B. The irregularities accelerate the spread of the rinse agent on the inner surfaces of the circumferential walls 3A and 3B. The irregularities also reduce the speed at which the rinse agent flows and covers or coats the inner surfaces 3a and 3b. Thus, the satin finish prevents the splashed droplets of the scattered liquid agent from adhering to the inner surfaces 3a and 3b and reduces the consumption of the rinse agent.

The bottom wall 7 has a waste liquid drain for discharging the waste liquid. The drain 8 is formed near a periphery of the bottom wall 7. The bottom wall 7 further includes a ventilation duct 9 for venting the air in the cup 1. The ventilation duct 9 is formed on the opposite side of the waste liquid drain 8 with respect to the center of the bottom wall 7. The ventilation duct 9 is nearer to the central portion of the bottom wall 7 than the waste liquid drain 8. The ventilation duct 9 is connected to a forcible ventilation device (not illustrated).

The central portion of the bottom wall 7 surrounding the spinchuck 10 is raised above the other and an upper surface 7a thereof forms a ring-portions shaped plane surface which surrounds the spinchuck 10. A ring-shaped protruding wall 7b is formed on the upper surface of the bottom wall 7. The wall 7b surrounds the spinchuck 10. The waste liquid drain 8 is located outside the protruding wall 7b. The ventilation duct 9 is located inside the protruding wall 7b. The protruding wall 7b divides the lower portion of the cup 1 into a waste liquid zone Z1 and a ventilation zone Z2. The waste liquid zone Z1 is on the outward side of the wall 7b. The ventilation zone Z2 is on the inward side of the wall 7b.

Figure 5:
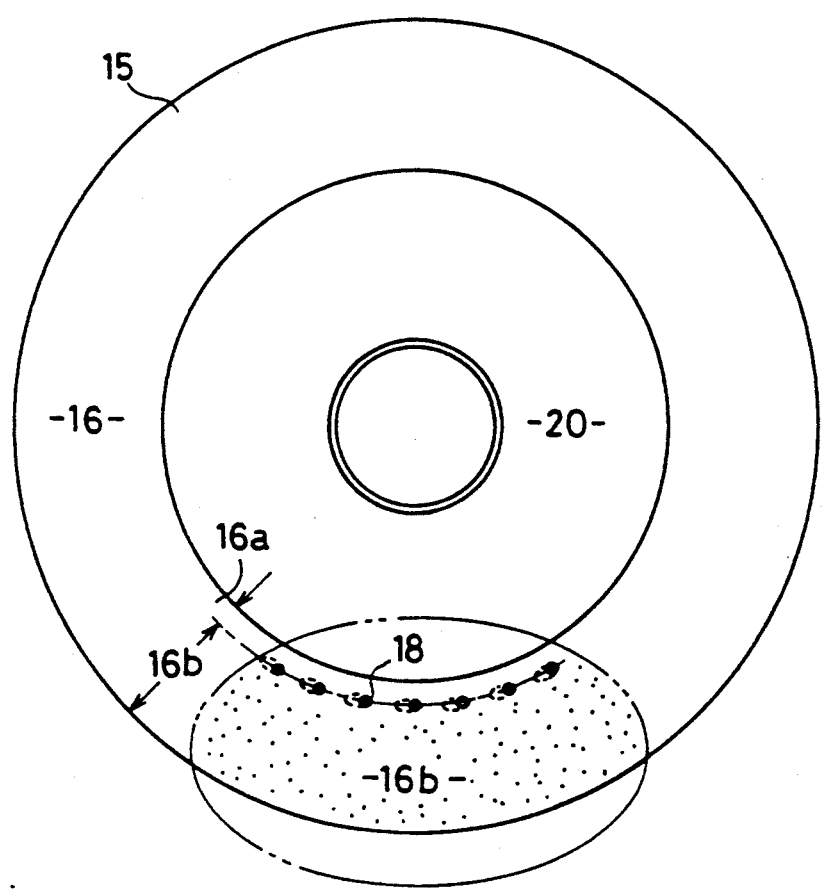
FIG. 5 is a plan view of a member for regulating the air flow in a cup of the apparatus of FIG. 3.

Referring to FIGS. 3 and 5, the member 15 for regulating the air flow is provided below the spinchuck 10 and seated on the upper surface 7a of the central protruding portion of the bottom wall 7 in the lower cup 1B. The member 15 has a slanted surface 16 for regulating the air flow A entering from the air intake 2 and flowing down along the periphery of the substrate W and for guiding the air flow A to the lower cup 1B. The central portion of the slanted surface 16 is concaved to form a central bottomed opening 20. The member 15 guides splashed droplets of the liquid agent guided downward by the slant inner surface 3a of the upper cup 1A toward the lower cup 1B by means of the air flow A.

The member 15 further includes an integrally formed ring-shaped conduit 17. The conduit 17 is located along the upper half portion of the lower surface of the member 15. The conduit 17 supplies the rinse agent to the slanted surface 16. The member 15 has a large number of discharge openings 18 for discharging the rinse agent. The openings 18 are formed in the upper portion of the surface 16. The conduit 17 and the member 15 are structured such that the externally supplied rinse agent S flows from the discharge openings 18 downward to and along the slanted surface 16.

Like the discharge openings 5, each discharge opening 18 extends slightly slanted with respect to a direction tangent to the inner surface 3a of the circumferential wall 3A. The rinse agent 19 flowing out onto the surface 16 spreads along the surface 16 in a generally downward and circumferential direction and slowly flows down the surface 16.

A region 16a (FIG. 5) of the surface 16 on an upstream side of the discharge openings 18 is "mirror-finished". The upstream region 16a prevents the rinse agent from entering the central bottom opening 20 of the member 15. A region 16b of the surface 16 on a downstream side of the discharge openings 18 is satin-finished, thereby allowing the region 16b to be coated entirely by the rinse agent, like the inner surfaces 3a and 3b.

The member 15, the discharge openings 18 and the conduit 17 prevent splashed droplets of the scattered liquid agent from adhering to the surface 16 and reduce consumption of the rinse agent.

Referring to FIG. 3, the member 15 extends outwardly of the protruding wall 7b from above the ventilation duct 9. The bottom wall 7 of the lower cup 1B is bent downward near its periphery to form a ring-shaped groove in the cup 1. The portion of the member 15 which extends over the ring-shaped groove causes the air flow A flowing down along the surface 16 to change direction and flow through the waste liquid zone Z1 to the ventilation zone Z2. This minimizes the penetration of splashed droplets of the liquid agent into the ventilation zone Z2, thereby reducing the amount of liquid agent which adheres to the inside of the ventilation duct 9. The apparatus can normally operate with a longer interval between the rinsing of the ventilation duct 9.

In operation, the substrate W is placed on the spinchuck 10 by a substrate transporter (not illustrated). The spinchuck 10 supports the central portion of the lower surface of the substrate W by vacuum suction or the like. The nozzle 11 supplies the liquid agent (such as photoresist) onto the substrate W. The spinchuck 10 rotates about the spin axis such that excess photoresist is scattered from the substrate W. The remaining photoresist forms a uniform layer on the substrate W. Rinse agent S (such as organic solvent) is externally supplied to the conduits 4 and 17 at a predetermined rate. The rinse agent S supplied to the conduit 4 flows out of the discharge openings 5 in a generally downward and circumferential direction along the inner surface 3a. Since there are a large number of the discharge openings 5, a uniform layer of the rinse agent S is formed on the inner surfaces 3a and 3b.

The rinse agent S supplied to the conduit 17 flows out of the discharge openings 18 in a generally downward and circumferential direction and spreads and flows down the surface 16. Since there are a large number of the discharge openings 18, a uniform layer of the rinse agent S is formed on the surface 16.

The air in the cup 1 is forcibly discharged from the ventilation duct 9. The air enters the cup 1 through the air intake 2.

A part of the photoresist scattered from the substrate W adheres to the inner surfaces 3a and 3b of the circumferential wall 3. But this photoresist dissolves in the rinse agent and falls down to the bottom wall 7 of the cup 1. Some of the splashed droplets of photoresist are transported downwardly by the air flow A and reach the bottom wall 7 directly. Other droplets adhere to the surface 16. However, the photoresist adhering to the surface 16 dissolves in the rinse agent 5 and flows down the surface 16 to the bottom wall 7.

The collected photoresist and rinse agent in the groove of the bottom wall 7 flow to the waste liquid drain 8 and are discharged therethrough. The air in the cup 1 is forcibly discharged from the ventilation duct 9 to the outside.

Since the conduit 4 is formed on the outside of the wall 3A, photoresist cannot adhere to and dry out on the conduit 4. The conduit 17 is formed in the upper half portion of the lower surface of the member 15. In addition, the member 15 and the groove formed in the bottom wall 7 essentially prevent photoresist from entering the space surrounded by the member 15. Therefore, it is very unlikely that splashed droplets of photoresist will adhere to and dry out on the conduit 17.

The present invention greatly reduces the possibility that photoresist will dry out and scatter in the cup 1, compared to the conventional apparatus wherein the conduit for supplying the rinse agent is exposed in the cup 1. Accordingly, the possibility that particles of dried photoresist will adhere to the substrate is reduced. Production yield in terms of forming a layer of liquid agent (such as a layer of photoresist) on the substrate W is thereby increased.

The present invention is not limited to the above-described preferred embodiment. For example, the cup 1 may be integrally formed. The cup 1 need not be formed of detachable cups 1A, 1B.

Figure 1:
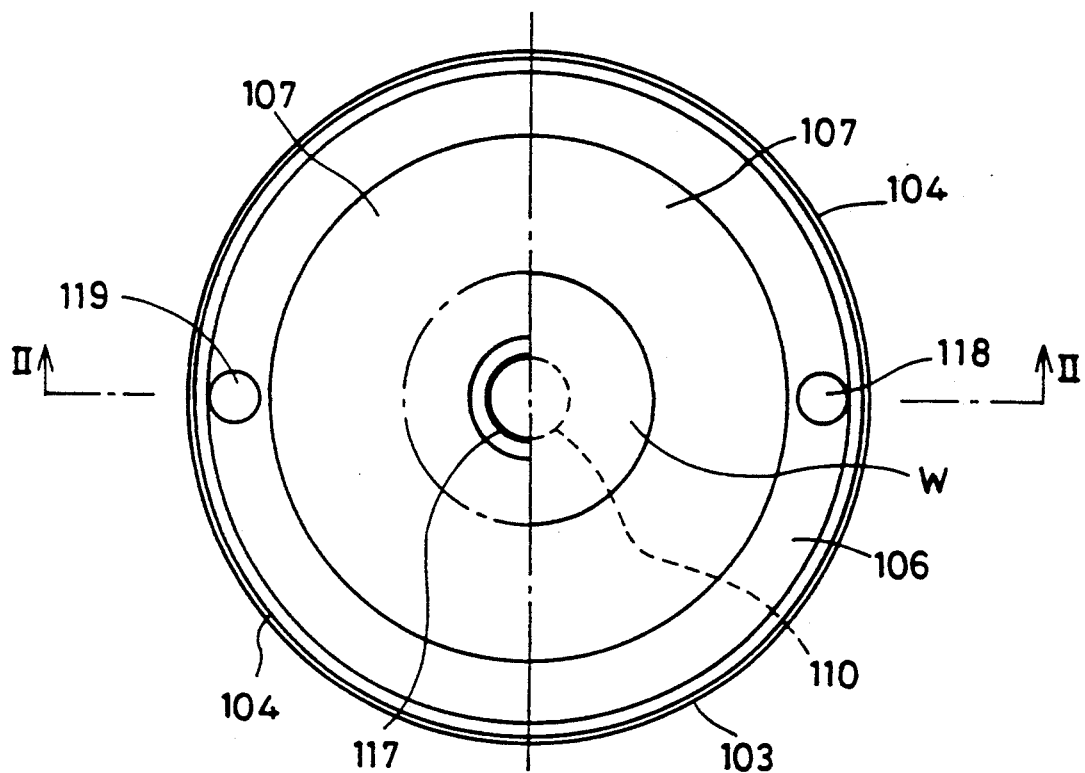
FIG. 1 is a plan view of a conventional apparatus.
Figure 2:
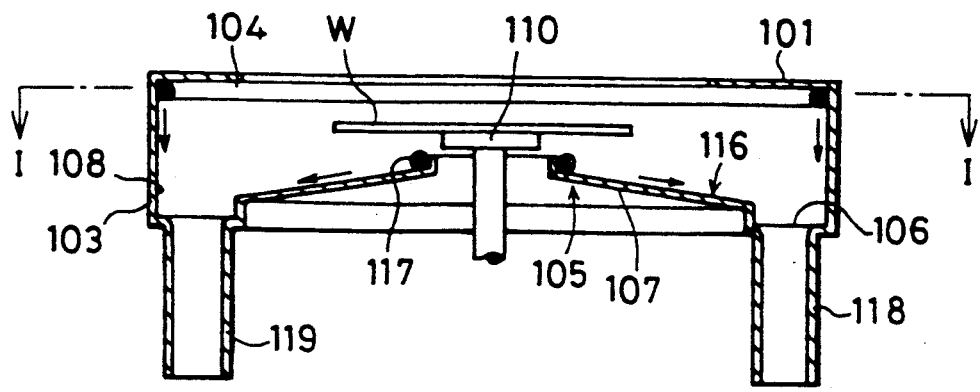
FIG. 2 is a sectional view taken in the direction of the arrow II—II of FIG. 1.

Moreover, in the above-described embodiment, the air flow regulating member 15 is provided in addition to the bottom wall 7, and the conduit 17 for supplying rinse agent is integrally formed with the member 15 thereunder. However, the present invention is not limited thereto. A bottom wall 107 of FIGS. 1 and 2 may be used to regulate air flow, and a conduit for rinsing the slanted surface may be provided below the bottom wall 107.

Although the present invention has been described and illustrated in detail, it is clearly understood that the same is by way of illustration and example only and is not to be taken by way of limitation. The spirit and scope of the present invention should be limited only by the appended claims.

What is claimed is:

1. An apparatus for applying liquid agent to a substrate, said apparatus comprising:
   (a) means for supporting and rotating a substrate about a spin axis;
   (b) means for applying liquid agent to said substrate;
   (c) a cup member for preventing liquid agent from scattering, said cup member including a circumferential wall having an inner circumferential surface and an outer circumferential surface, said circumferential wall forming a generally conical surface having an upper portion, said upper portion including a plurality of openings, each of said openings extending through said circumferential wall and being slightly slanted with respect to a direction tangent to the inner surface of the circumferential wall;
   (d) first cleaning agent supplying means for supplying cleaning agent to said inner circumferential surface through said openings, said cleaning agent supplying means being integrally formed on said outer circumferential surface of said circumferential wall;
   (e) a slanted member with a slanted upper surface for regulating and guiding air, liquid agent and cleaning agent downwardly through said cup member, said slanted surface being located below said supporting means, said slanted surface including an upper portion with a plurality of openings formed therein, said slanted member having a rear surface and a lower edge, each of said openings formed in said upper portion of said slanted surface extending through said slanted member and being slightly slanted with respect to a direction tangent to the slanted surface; and
   (f) second cleaning agent supplying means for supplying cleaning agent to said slanted surface by supplying cleaning agent through said openings of said slanted surface, said second cleaning agent supplying means being formed on said rear surface of said slanted member;
   wherein said apparatus includes fine irregularities on said inner circumferential surface for spreading cleaning agent.

2. The apparatus of claim 1, further comprising:
   (g) a waste liquid zone for collecting liquid agent and cleaning agent drained from said inner circumferential surface and said slanted surface;
   (h) a ventilation zone for collecting air which is guided by said slanted member; and
   (i) a separating wall for separating said ventilation zone from said waste liquid zone, said separating wall being located radially within said lower edge of said slanted member, said separating wall having an upper edge which is located above said lower edge of said slanted member.

3. An apparatus for applying liquid agent to a substrate, said apparatus comprising:
   (a) means for supporting and rotating a substrate about a spin axis;
   (b) means for applying liquid agent to said substrate;
   (c) a cup member for preventing liquid agent from scattering, said cup member including an inner circumferential surface and an upper portion forming a generally conical surface opening downwardly, said upper portion of said circumferential surface including a plurality of openings, each of said openings extending through said circumferential surface and being slightly slanted with respect to a direction tangent to said circumferential surface;
   (d) first cleaning agent supplying means for supplying cleaning agent to said inner circumferential surface through said openings;
   (e) a slanted surface for regulating and guiding air, liquid agent and cleaning agent downwardly through said cup member, said slanted surface having an upper portion with a plurality of openings formed therein, each of said openings extending through said slanted surface and being slightly slanted with respect to a direction tangent to the slanted surface; and
   (f) second cleaning agent supplying means for supplying cleaning agent to said slanted surface through said openings of said slanted surface; and
   (g) fine irregularities formed on said inner circumferential surface of said cup member for spreading cleaning agent along said inner circumferential surface.

4. The apparatus of claim 3, further comprising fine irregularities formed on said slanted surface beneath said openings of said slanted surface so as to spread cleaning agent on said slanted surface.

5. The apparatus of claim 4, wherein said slanted surface has a central opening for accommodating said supporting means, said slanted surface being mirror finished above said openings of said slanted surface so as to prevent cleaning agent from reaching said central opening.

6. The apparatus of claim 3, further including fine irregularities formed on said upper portion of said slanted surface for spreading cleaning agent along said slanted surface.

* * * * *